United States Patent
Garboushian et al.

[11] Patent Number: 6,020,555
[45] Date of Patent: Feb. 1, 2000

[54] SYSTEM FOR PROTECTING SERIES CONNECTED SOLAR PANELS AGAINST FAILURE DUE TO MECHANICAL DAMAGE OF INDIVIDUAL SOLAR CELLS WHILE MAINTAINING FULL OUTPUT OF THE REMAINING CELLS

[75] Inventors: Vahan G. Garboushian, Torrance; Gerald A. Turner, Long Beach, both of Calif.

[73] Assignee: Amonix, Inc., Torrance, Calif.

[21] Appl. No.: 08/848,797

[22] Filed: May 1, 1997

[51] Int. Cl.[7] .................. H01L 31/0352; H01L 31/05
[52] U.S. Cl. .............................. 136/256; 136/293
[58] Field of Search .................. 136/293, 249, 136/291, 292, 244, 255, 256; 307/52, 63, 84

[56] References Cited

U.S. PATENT DOCUMENTS

| | | | |
|---|---|---|---|
| 3,437,818 | 4/1969 | Shattuck | 250/212 |
| 3,912,539 | 10/1975 | Magee | 136/89 |
| 4,323,719 | 4/1982 | Green | 136/249 |
| 4,456,782 | 6/1984 | Nishiura et al. | 136/244 |
| 4,481,378 | 11/1984 | Lesk | 136/244 |
| 4,933,022 | 6/1990 | Swanson | 136/249 |

*Primary Examiner*—Nam Nguyen
*Assistant Examiner*—Michael C. Miggins
*Attorney, Agent, or Firm*—Ellsworth R. Roston; Fulwider Patton Lee & Utecht, LLP

[57] ABSTRACT

Each of a plurality of solar cells is disposed on a base member made from an electrically insulating material. Each of the solar cells has first and second cell portions separated by an insulating gap, the first cell portion being positive and the second portion being negative. A third cell portion may be provided in each solar cell with the first portion being disposed between, and in insulated relationship to, the second and third portions and with the third portion being negative. Each of the solar cells may include a positive termination extending from the first cell portion and a negative termination extending from the second (and third) cell portion(s) and separated from the first cell portion by an insulating gap. Each of a plurality of diodes is disposed on an individual one of the base members across the insulating gap between the positive and negative terminations of an individual one of the solar cells on the base member. Each of the diodes includes a cathode disposed on the positive termination of the individual one of the base members in electrical continuity with such positive termination and includes an anode disposed on the negative termination of the individual one of the base members in electrical continuity with such negative termination. The other cells are in series such that the positive termination in each cell is continuous with the negative termination in the next cell. In this way, the diode connected across each cell bypasses such cell when such cell is damaged or shadowed.

15 Claims, 2 Drawing Sheets

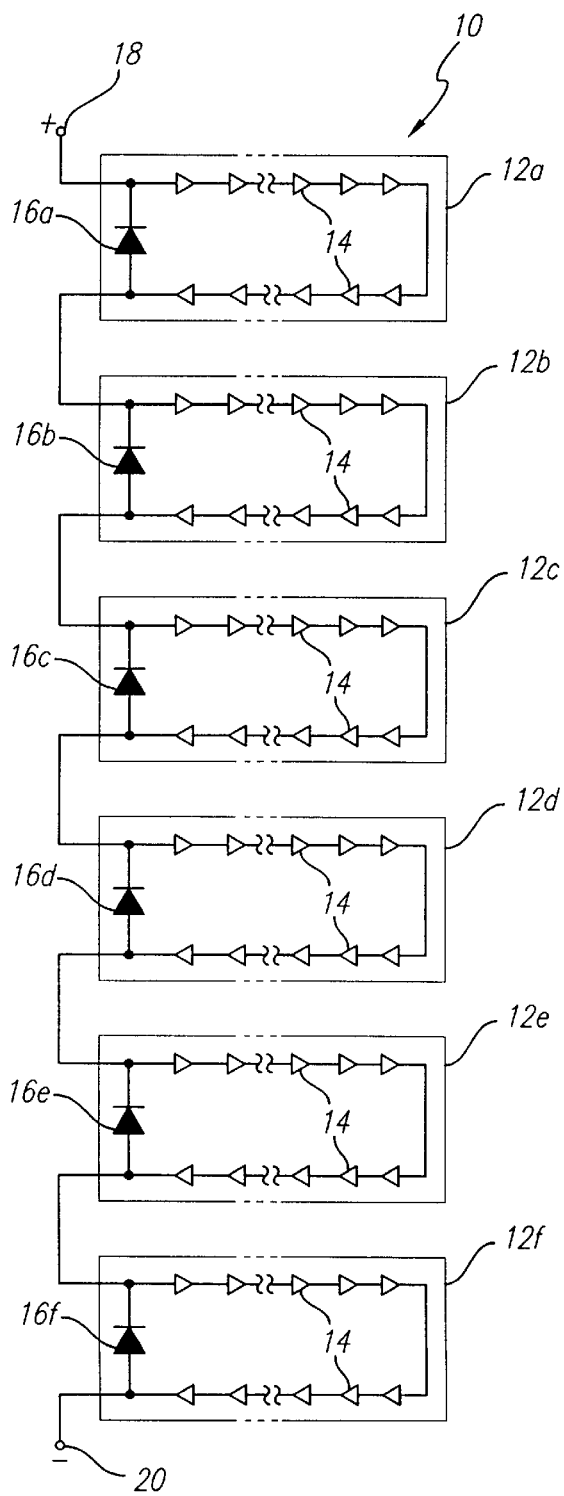
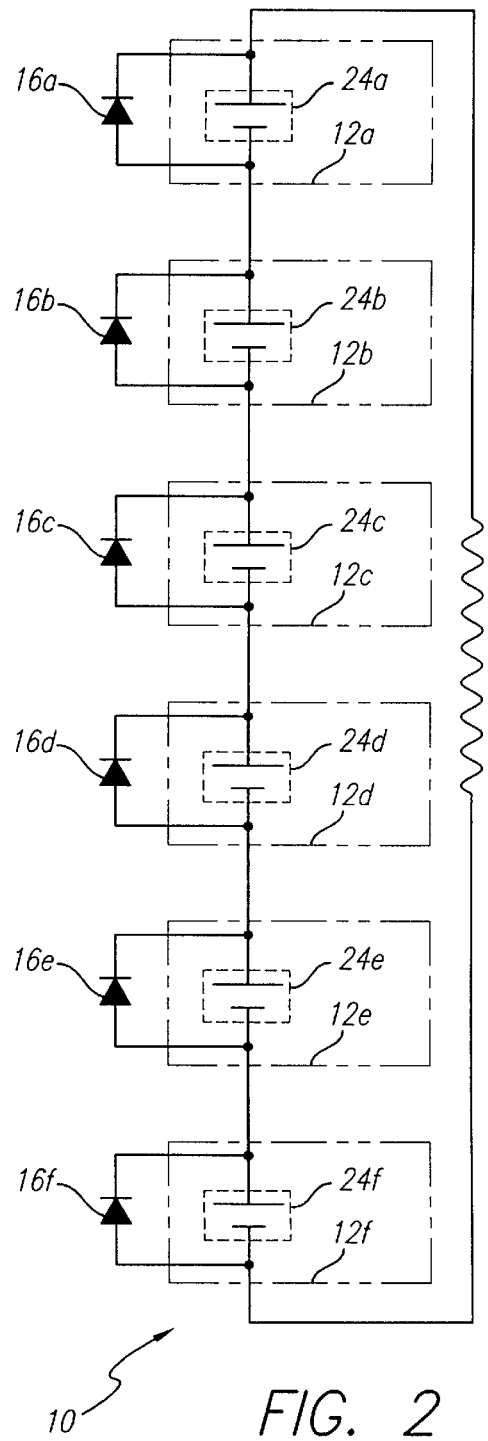
FIG. 1
PRIOR ART
FIG. 2
PRIOR ART

SYSTEM FOR PROTECTING SERIES CONNECTED SOLAR PANELS AGAINST FAILURE DUE TO MECHANICAL DAMAGE OF INDIVIDUAL SOLAR CELLS WHILE MAINTAINING FULL OUTPUT OF THE REMAINING CELLS This invention relates to solar cells and more particularly to a system for protecting against loss of power when any one of the cells is damaged or shadowed. More particularly, the invention relates to a system for automatically bypassing damaged or shadowed cells in the system while maintaining the operation of all of the other cells in the system.

BACKGROUND OF THE INVENTION

Solar cells are used to convert radiant energy into electricity. Solar cells used for these purposes operate at low cost since the energy generated by such solar cells is received from the sun. Solar cells are used for a wide variety of purposes. For example, solar cells are used to pump water, provide air conditioning and to provide electricity in homes.

Generally a plurality of solar cells are used to generate heat. The solar cells are disposed in panels, there being illustratively twenty four (24) solar cells in each panel. The solar cells in each panel are connected in series. Generally a plurality of panels are used in a system and the panels are connected in series.

Occasionally a solar cell in a particular panel will become damaged or become shadowed by an obstruction. Generally the obstruction is quite large so that several adjacent solar cells in the particular panel become shadowed simultaneously. The current carrying capacity of the particular panel becomes reduced and the output from other panels in a series relationship with the particular panel reverse biases the damaged or shadowed cells. The voltage across the damaged or shadowed cells then increases in a reverse polarity until the algebraic sum of the voltages in the reverse biased cells in the panel and the undamaged or unshadowed cells on the panel reaches a negative value of about one half of a volt (−0.5 V).

The voltage across the damaged or shadowed cells then increases in a reverse polarity until the full output voltage of all of the panels appears across the damaged or shadowed cells in the particular panel. This causes the damaged or shadowed cells to break down on a reverse basis at a relatively high breakdown voltage. The damaged or shadowed cells in the particular panel then dissipate a large amount of power, particularly as a result of the relatively high reverse breakdown voltage.

The problems discussed in the previous paragraphs have been partially resolved in the prior art. In the prior art, a diode has been connected in parallel with the solar cells in each panel. Thus, if a panel has had twenty-four (24) cells in series, a diode has been connected in parallel with the series arrangement of the twenty-four (24) solar cells. In the parallel arrangement, the cathode of the diode has been connected to the positive termination of the cells in the panel and the anode of the diode has been connected to the negative termination of the cells in the panel.

The connection of the diode to the solar cells in the panel has biased the diode against current flow while all of the cells are operative in generating energy. However, when at least one of the solar cells in the panel becomes damaged or shadowed, the diode provides a low impedance path by-passing all of the solar cells in the panel. By by-passing all of the solar cells in the panel, power being dissipated in the damaged or shadowed cells in the panel is limited to, at most, that generated by the undamaged/unshadowed cells in such panel.

The connection of a diode to the solar cells in each individual one of the panels as discussed in the last two (2) paragraphs provides an advantage in the operation of the solar cells. However, it causes all of the solar cells in a panel to be by-passed even though only one or a few of the solar cells in the panel may be damaged or shadowed. As a result, the undamaged or unshadowed cells in the panel are by-passed. This limits the ability of a system including such panel to generate electrical power. It would, accordingly, be desirable to provide a system in which only the damaged or shadowed cells in the panel, rather than all of the cells in the panel, are by-passed. To applicant's best knowledge and information, no one has provided such a system as of this time.

BRIEF DESCRIPTION OF THE INVENTION

In one embodiment of the invention, each of a plurality of solar cells is disposed on a base member made from an insulating material. Each of the solar cells has first and second cell portions separated by an insulating gap, the first cell portion being positive and the second portion being negative. A third cell portion may be provided in each solar cell with the first portion being disposed between, and in insulated relationship to, the second and third portions and with the third portion being negative.

Each of the solar cells may include a positive termination extending from the first cell portion and a negative termination extending from the second (and third) cell portion(s) and separated from the first cell portion by an insulating gap. Each of a plurality of diodes is disposed on an individual one of the base members across the insulating gap between the positive and negative terminations of an individual one of the solar cells on the base member.

Each of the diodes includes a cathode disposed on the positive termination of the individual one of the base members in electrical continuity with such positive termination and includes an anode disposed on the negative termination of the individual one of the base members in electrical continuity with such negative termination. The other cells are in series such that the positive termination in each cell is continuous with the negative termination in the next cell. In this way, the diode connected across each cell bypasses such cell when such cell is damaged or shadowed.

BRIEF DESCRIPTION OF THE DRAWINGS

In the drawings:

FIG. 1 is a diagram, partially schematic, of a prior art system, including a plurality of panels, each including a plurality of solar cells in series and each including a diode connected in parallel with such solar cells, for generating solar energy and for by-passing panels with damaged or shadowed solar cells;

FIG. 2 is a diagram, partially schematic, of the prior art system shown in FIG. 1 and shows the prior art system in additional detail;

DETAILED DESCRIPTION OF THE INVENTION

Figure 3:
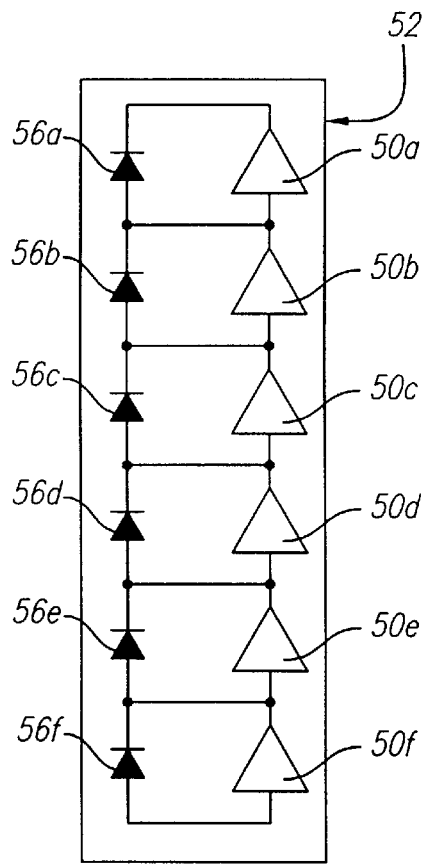
FIG. 3 is a diagram, partially schematic, of a system constituting one embodiment of the invention in which a diode is connected in parallel with each individual one of the solar cells to provide an enhanced operation in comparison to the prior art system shown in FIG. 1.

FIG. 1 shows a system, generally indicated at 10, of the prior art for generating energy such as heat or electricity from solar energy. The system 10 includes a plurality of panels 12a, 12b, 12c, 12d, 12e and 12f, each including a plurality of solar cells 14 for generating electricity from solar energy. The panels 12a–12f and the solar cells 14 may be constructed in a conventional manner well known in the prior art. Generally, a suitable number of solar cells, such as twenty-four (24), are connected in a series relationship in each of the panels 12a–12f. A plurality of diodes 16a–16f are provided each respectively associated with an individual one of the panels 12a–12f. Each of the diodes 16a–16f is connected between the first and last of the solar cells 14 connected in series in the individual one of the panels 12a–12f. The system shown in FIG. 1 includes a positive termination 18 at the input end of the panel 12a and a negative termination 20 at the output end of the panel 12f.

FIG. 2 shows the prior art system 10 of FIG. 1 in additional detail on a somewhat schematic basis. As shown in FIG. 2, each of the panels 12a–12f is shown as being enclosed within a rectangle in broken lines. For example, the panel 12a is shown as being enclosed within a rectangle 22a in broken lines. The solar cells 14 in each panel are shown as being equivalent to a battery with the positive terminal of the battery in each panel being above the negative terminal of the battery. The batteries in the panels 12a–12f are respectively indicated as 24a–24f. The diodes 16a–16f are shown as being respectively connected to the batteries 24a–24f with the cathode of each diode connected to the positive terminal of the associated battery and the anode of each diode connected to the negative terminal of the associated battery.

The battery 24c and the diode 16c are illustrative of all of the other arrangements of the associated batteries and diodes. As will be seen, the positive terminal of the battery 24c biases the cathode of the diode 16c positive. This prevents the diode 16c from conducting current while all of the solar cells 14 are operative. As a result, all of the solar cells 14 in the panel 12a are effective in generating electricity.

When one or more of the solar cells 14 in the panel 12a become damaged or shadowed, such solar cells cannot generate electricity. This produces an open circuit in the panel 12a. As a result, the negative voltage on the batteries 24a–24f in the panels 12b–12f is applied to the cathode of the diode 16a through the resistive load (L). This causes a negative voltage such as approximately one-half of a volt (−0.5 V) to be applied to the cathode of the diode 16a. This negative voltage forward biases the diode 16a so that the diode is able to conduct current. This current by-passes the panel 12a and provides for a continuous electrical path through the other panels.

If the diode 16a were not connected across the panel 12a, the negative voltage generated in the batteries 24b–24f would produce a reverse bias on the damaged or shadowed cells in the panel 12a. This reverse bias would cause the damaged or shadowed solar cells 14 in the panel 12a to break down and a considerable amount of heat to be generated in such solar cells.

The diode 16a by-passes all of the solar cells 14 in the panel 12a when only one of the solar cells in the panel 12a becomes damaged or shadowed. This is inefficient when a considerable number of solar cells such as twenty-four (24) are included in the panel. It would be desirable to provide a system in which only the damaged or shadowed solar cells 14 in the panel 12a are by-passed by diodes. However, no one has provided such a system until now.

FIG. 3 shows a plurality of solar cells 50a–50f in a panel generally indicated at 52. Only six (6) solar cells 50a–50f are shown in the panel for illustrative purposes, but it will be appreciated that any number of cells can be provided in the panel. It will also be appreciated that a plurality of panels can be provided in the embodiment shown in FIG. 3 in a manner similar to the showing of a plurality of panels as in the embodiment shown in FIGS. 1 and 2.

FIG. 3, a plurality of diodes 56a–56f are provided each connected to an individual one of the solar cells 50a–50f. As in the embodiment shown in FIGS. 1 and 2, the solar cells 50a–50f in the embodiment shown in FIG. 3 may be considered to constitute batteries indicated in FIG. 4 at 58a–58f within broken rectangles 60a–60f. Each of the diodes 56a–56f may constitute a semi-conductor device formed from a chip of a crystalline semiconductor material.

The solar cell 50a and the diode 56a may be disposed on an insulated base 60 such that the diode and the solar cell are in insulated relationship to each other. Actually, all of the solar cells 50a–50f and all of the diodes 56a–56f may be disposed on the same insulated base 60 such that the solar cells 50a–50f are disposed in spaced and insulated relationship to each other.

The cathode of each of the diodes 56a–56f is connected to the positive terminal of the individual one of the batteries 58a–58f and the anode of each of the diodes 56a–56f is connected to the negative terminal of the individual one of the batteries 58a–58f. Thus, when one of the solar cells 50a–50f becomes damaged or shadowed, the individual one of the diodes 56a–56f becomes biased in a forward direction so that a by-pass current flows only through that diode. In this way, the other ones of the solar cells 50a–50f in the panel 52 continue to be effective in generating electricity from the solar energy received by such solar cell.

Figure 4:
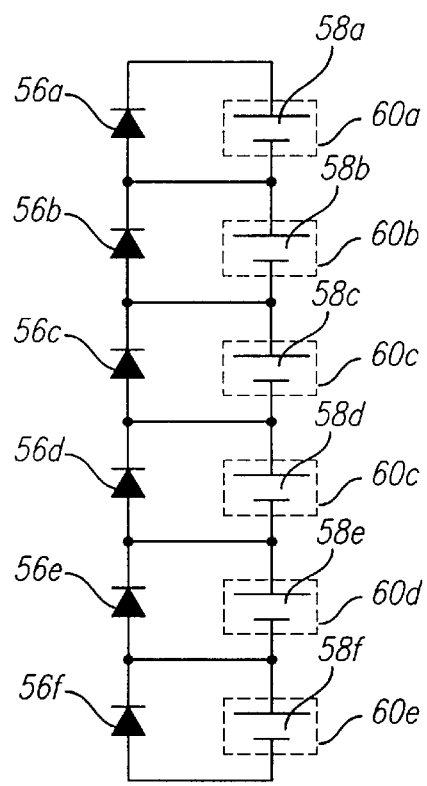
FIG. 4 is a view similar to that shown in FIG. 2 and shows in additional detail the embodiment of the invention shown in FIG. 2.
Figure 5:
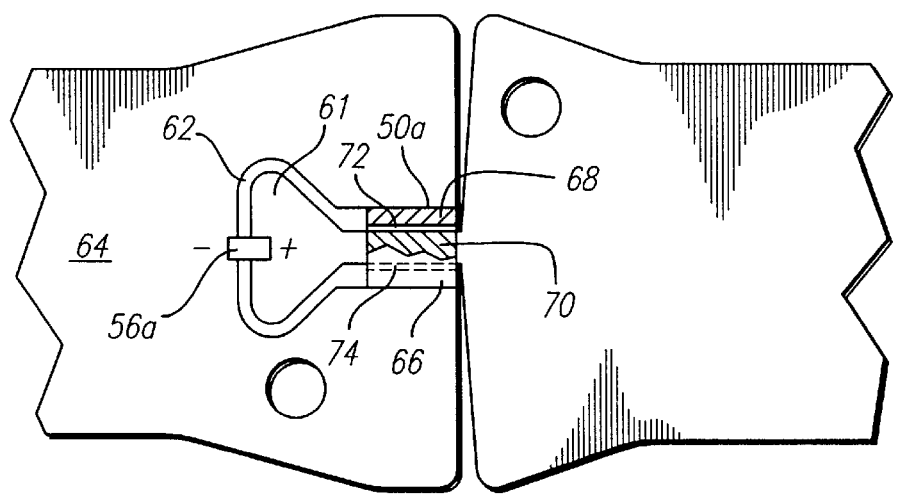
FIG. 5 is a plan view showing the details of construction of one of the solar cells and the associated diode included in the system shown in FIGS. 3 and 4 and constituting one embodiment of the invention.
Figure 3:
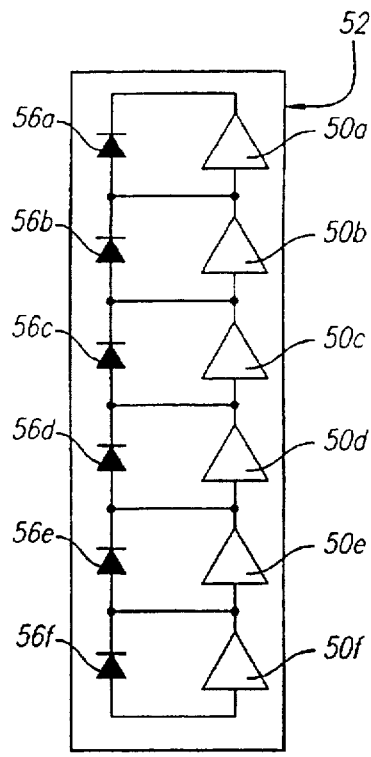
Figure 4:
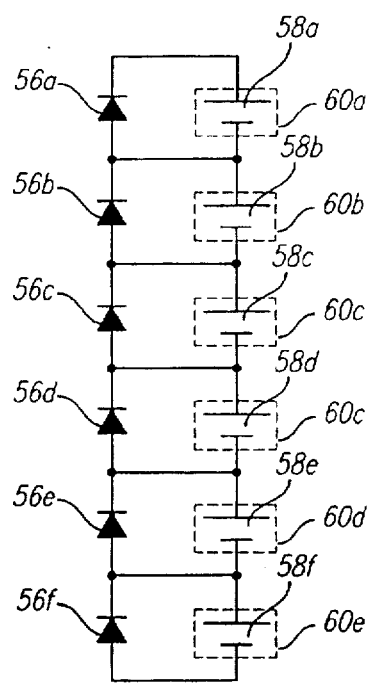
Figure 5:
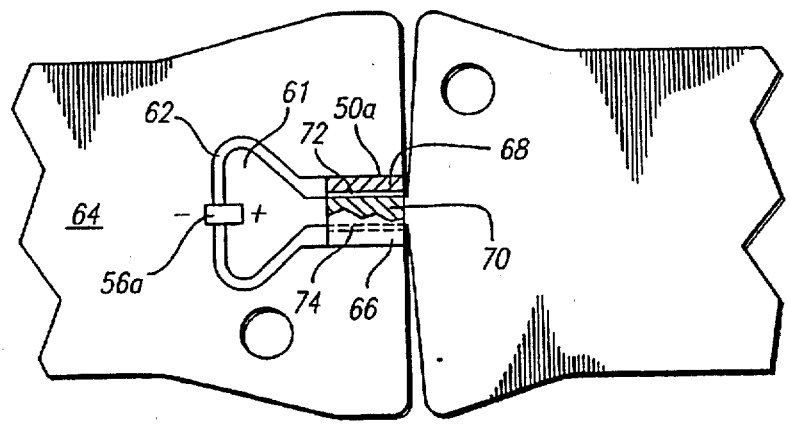

FIG. 5 is a plan view showing the construction of one of the solar cells 50a–50f and the associated one of the diodes 56a–56f in the embodiment shown in FIGS. 3 and 4. It will be appreciated that the same embodiments as shown in FIG. 5 may be used to provide the interrelationship between the other solar cells and the diodes in the panel 52.

As shown in FIG. 5, the solar cell 50a includes a positive termination 61 respectively separated by an air gap 62 from a negative termination 64. The negative termination 64 may be defined in part by a pair of terminals 66 and 68 straddling a positive terminal 70 which defines in part the positive termination 61. The terminals 66 and 68 are respectively separated from the positive terminal 70 by air gaps 72 and 74.

The diode 56a effectively straddles the positive termination 61 and the negative termination 64 across the air gap 62. The cathode of the diode 56a communicates electrically with the positive termination 61 and the anode of the diode communicates electrically with the negative termination 64. The diode 56a may be electrically isolated from the positive termination 61 except at the position of the cathode of the diode and may be electrically isolated from the negative termination 64 except at the position of the anode of the diode.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

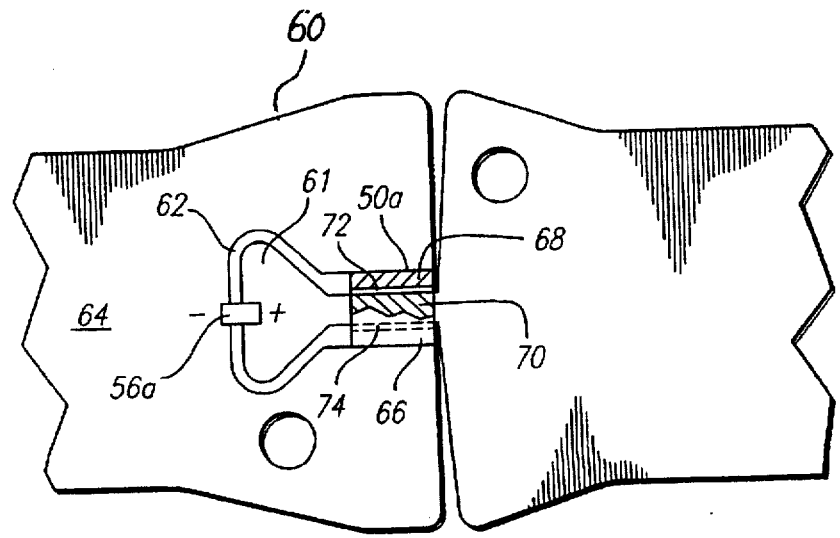

What is claimed is:

1. Apparatus for generating solar energy, including,
   a plurality of solar cells 50a–50f connected in a series relationship, and
   a plurality of diodes 50a–50f each diode having an anode and a cathode and each connected to an individual one of the solar cells for reverse biasing such diode against conductivity during the operation of the individual one of the solar cells in generating solar energy and each operative to provide a current by-passing such individual one of the solar cells when such individual one of the solar cells becomes damaged or shadowed,
   each of the solar cells having a positive termination 61 and a negative termination 64,
   there being an air gap 62 between the positive termination and the negative termination of each of the solar cells,
   the negative termination of each solar cell being defined in part by negative terminals 66 and 68 disposed in the air gap 62 for that solar cell and being separated by air gaps 72 and 74 for that solar cell from the positive termination 61 defined in part by a positive terminal 70.

2. Apparatus as set forth in claim 1 for generating solar energy, including, the cathode of each individual one of the diodes being connected to the positive termination of the associated one of the solar cells and the anode of the individual one of the diodes being connected to the negative termination of the associated one of the solar cells for reverse biasing of such diode and the individual one of the diodes straddling the air gap between the positive termination and the negative termination of the associated one of the solar cells.

3. Apparatus as set forth in claim 2 for generating solar energy, including,
   a base member made from an insulating material, and
   the solar cells being disposed on the base member and the diodes being disposed on the base member in electrically isolated relationship to the solar cells on the base member.

4. Apparatus as set forth in claim 1 for generating solar energy, including,
   each of the diodes being connected in parallel with the individual one of the solar cells for reverse biasing such diode against conductivity during the operation of the individual one of the solar cells in generating solar energy and each operative to provide a current by-passing such individual one of the solar cells when such individual one of the solar cells becomes damaged or shadowed,
   each diode straddling the air gap in the associated one of the solar cells and the cathode of each diode being connected to the positive termination of the associated one of the solar cells and the anode of each diode being connected to the negative termination of the associated one of the solar cells.

5. Apparatus as set forth in claim 3 for generating solar energy, including,
   a base member made from an insulating material, and
   the solar cells being disposed on the base member and the diodes being disposed on the base member in electrically isolated relationship to the solar cells on the base member.

6. Apparatus as set forth in claim 1 for generating solar energy, including,
   a base member made from an insulating material, and
   the solar cells in the plurality being disposed on the base member and the diodes being disposed on the base member in electrically isolated relationship to the solar cells.

7. Apparatus for generating solar energy, including,
   a base member 60 made from an electrically insulating material,
   a plurality of solar cells 50a–50f each constructed to generate solar energy and each disposed on the base member and each providing a positive termination 61 and a negative termination 64 electrically isolated from each other, and
   a plurality of diodes 56a–56f each disposed on the base member in an insulated and straddling relationship to an individual one of the solar cells on the base member and each including an anode connected to the negative termination 64 of the individual one of the solar cells and a cathode connected to the positive termination 61 of the individual one of the solar cells, and
   circuitry connecting the solar cells for cumulatively providing the solar energy generated in the individual ones of the solar cells,
   the positive termination 61 and the negative termination 64 for each solar cell being provided with an air gap 62 and the cathode and anode of each of the diodes straddling the air gap of the associated one of the solar cells,
   the solar cell having positive 70 and negative terminals 66 and 68 respectively defining in part the positive and negative terminations and one of the terminals in each solar cell being disposed in the air gap of that solar cell in isolated relationship to the other one of the terminals in that solar cell.

8. Apparatus as set forth in claim 7 for generating solar energy, including,
   the circuitry providing a connection of the individual ones of the solar cells in a series relationship,
   the negative termination in each solar cell being defined by a pair of terminals disposed in the air gap of the solar cell and separated in the air gap from the positive terminal partially defining the positive termination.

9. Apparatus as set forth in claim 8 for generating solar energy wherein
   each of the diodes is a semiconductor device and wherein
   the pair of negative terminals for each solar cell are disposed on opposite sides of the positive terminal for the solar cell in electrically isolated relationship in the air gap of the solar cell to the positive terminal of the solar cell.

10. Apparatus as set forth in claim 9 for generating solar energy wherein
    a base member made from an insulating material is provided with air gaps and wherein
    the solar cells are disposed on the base member and wherein
    the positive and negative terminations of each of the solar cells are separated on the base member by an individual one of the air gaps on the base member and each of the diodes is disposed on the base member with the anode of such diode on the negative termination on one side of the air gap in the base member for an associated one of the solar cells and with the cathode of such diode on the other side of the air gap in the base member for the associated one of the solar cells and with the diode straddling the positive and negative terminations of the associated one of the solar cells on the base member.

11. Apparatus as set forth in claim 8 for generating solar energy wherein each of the diodes is a semiconductor device formed from a crystalline semiconductor material and wherein each diode straddles the air gap for the associated one of the solar cells with the cathode of the diode on the positive termination of the associated one of the solar cells.

12. Apparatus for generating solar energy, including, a base member made from an electrically insulating material, a plurality of solar cells disposed on the base member, a plurality of air gaps each disposed in an individual one of the solar cells on the base member, each of the solar cells including at least a pair of cell portions separated from each other by an individual one of the air gaps in the base member, a first one of the cell portions providing a positive voltage and a second one of the cell portions providing a negative voltage, each of the solar cells including a positive termination extending from the first cell portion and a negative termination extending from the second cell portion and separated from the first cell portion by the air gap in that solar cell, and a plurality of diodes each disposed on the base member across an individual one of the air gaps between the positive and negative terminations of an associated one of the solar cells and each including a cathode disposed on the positive termination of the associated one of the solar cells in electrical continuity with the positive termination of the associated one of the solar cells and including an anode disposed on the negative termination of the associated one of the solar cells in electrical continuity with such negative termination and the anode and the cathode of each of the diodes being isolated electrically from each other.

13. Apparatus as set forth in claim 12 for generating solar energy wherein the cell portions in the solar cells in the plurality are connected in a series relationship.

14. Apparatus as set forth in claim 12 for generating solar energy wherein each of the solar cells has three (3) cell portions disposed on the base member and separated from one another on the base member by air gaps and wherein the first one of the cell portions in each of the solar cells is disposed between the second and third ones of the cell portions in such solar cell and wherein the first one of the cell portions in such solar cell provides the positive voltage and wherein the second and third cell portions in such solar cell provide the negative voltage and wherein the first one of the cell portions in each of the solar cells is separated in the air gap for that solar cell from the second and third ones of the cell portions for that solar cell.

15. Apparatus as set forth in claim 14 for generating solar energy wherein the cell portions in the solar cell are connected in a series relationship and wherein the positive termination in each of the solar cells is connected to the negative termination of the next one of the solar cells in the series relationship.

* * * * *

UNITED STATES PATENT AND TRADEMARK OFFICE
CERTIFICATE OF CORRECTION

PATENT NO. : 6,020,555  Page 1 of 3
DATED : February 1, 2000
INVENTOR(S) : Garboushian et al It is certified that error appears in the above-identified patent and that said Letters Patent is hereby corrected as shown below:

The title page, showing the illustrative figure, shoul be deleted and substitute therefor the attached title page.

The Drawing Sheet, consisting of Figure 5, should be deleted to be replaced with the Drawing Sheets, consisting of Fig. 5, as shown on the attached page.

Signed and Sealed this

Thirteenth Day of March, 2001

*Attest:*

NICHOLAS P. GODICI

*Attesting Officer*  Acting Director of the United States Patent and Trademark Office

United States Patent
Garboushian et al.

[11] Patent Number: 6,020,555
[45] Date of Patent: Feb. 1, 2000

[54] SYSTEM FOR PROTECTING SERIES CONNECTED SOLAR PANELS AGAINST FAILURE DUE TO MECHANICAL DAMAGE OF INDIVIDUAL SOLAR CELLS WHILE MAINTAINING FULL OUTPUT OF THE REMAINING CELLS

[75] Inventors: Vahan G. Garboushian, Torrance; Gerald A. Turner, Long Beach, both of Calif.

[73] Assignee: Amonix, Inc., Torrance, Calif.

[21] Appl. No.: 08/848,797

[22] Filed: May 1, 1997

[51] Int. Cl.[7] .................. H01L 31/0352; H01L 31/05
[52] U.S. Cl. .................................... 136/256; 136/293
[58] Field of Search .............................. 136/293, 249, 136/291, 292, 244, 255, 256; 307/52, 63, 84

[56] References Cited

U.S. PATENT DOCUMENTS

| | | | |
|---|---|---|---|
| 3,437,818 | 4/1969 | Shattuck | 250/212 |
| 3,912,539 | 10/1975 | Magee | 136/89 |
| 4,323,719 | 4/1982 | Green | 136/249 |
| 4,456,782 | 6/1984 | Nishiura et al. | 136/244 |
| 4,481,378 | 11/1984 | Lesk | 136/244 |
| 4,933,022 | 6/1990 | Swanson | 136/249 |

*Primary Examiner*—Nam Nguyen
*Assistant Examiner*—Michael C. Miggins
*Attorney, Agent, or Firm*—Ellsworth R. Roston; Fulwider Patton Lee & Utecht, LLP

[57] ABSTRACT

Each of a plurality of solar cells is disposed on a base member made from an electrically insulating material. Each of the solar cells has first and second cell portions separated by an insulating gap, the first cell portion being positive and the second portion being negative. A third cell portion may be provided in each solar cell with the first portion being disposed between, and in insulated relationship to, the second and third portions and with the third portion being negative. Each of the solar cells may include a positive termination extending from the first cell portion and a negative termination extending from the second (and third) cell portion(s) and separated from the first cell portion by an insulating gap. Each of a plurality of diodes is disposed on an individual one of the base members across the insulating gap between the positive and negative terminations of an individual one of the solar cells on the base member. Each of the diodes includes a cathode disposed on the positive termination of the individual one of the base members in electrical continuity with such positive termination and includes an anode disposed on the negative termination of the individual one of the base members in electrical continuity with such negative termination. The other cells are in series such that the positive termination in each cell is continuous with the negative termination in the next cell. In this way, the diode connected across each cell bypasses such cell when such cell is damaged or shadowed.

15 Claims, 2 Drawing Sheets